United States Patent
Sandhage

(10) Patent No.: US 11,891,343 B2
(45) Date of Patent: Feb. 6, 2024

(54) METHODS, MATERIALS SYSTEMS, AND DEVICES FOR INHIBITING INFILTRATION AND PENETRATION OF MOLTEN SALTS INTO SOLID MATERIALS

(71) Applicant: Purdue Research Foundation, West Lafayette, IN (US)

(72) Inventor: Kenneth Henry Sandhage, Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 632 days.

(21) Appl. No.: 16/995,138

(22) Filed: Aug. 17, 2020

(65) Prior Publication Data

US 2021/0047244 A1 Feb. 18, 2021

Related U.S. Application Data

(60) Provisional application No. 62/888,097, filed on Aug. 16, 2019.

(51) Int. Cl.
 *C04B 41/45* (2006.01)
 *C04B 41/46* (2006.01)
 *C04B 41/50* (2006.01)
 *C23C 14/04* (2006.01)

(52) U.S. Cl.
 CPC ...... *C04B 41/4535* (2013.01); *C04B 41/4531* (2013.01); *C04B 41/46* (2013.01); *C04B 41/5001* (2013.01); *C23C 14/046* (2013.01)

(58) Field of Classification Search
 CPC . C04B 41/4535; C04B 41/46; C04B 41/5001; C04B 41/009; C04B 41/478; C04B 41/82; C04B 2111/20
 See application file for complete search history.

(56) References Cited

U.S. PATENT DOCUMENTS

| | | | | |
|---|---|---|---|---|
| 2,407,868 A | * | 9/1946 | Burke | .......... C04B 41/009 501/99 |
| 3,640,518 A | * | 2/1972 | Lythe | ............. C04B 41/85 264/345 |
| 3,708,317 A | | 1/1973 | Owen et al. | |
| 3,964,899 A | | 6/1976 | Jones et al. | |
| 4,497,661 A | | 2/1985 | Valenti | |
| 4,558,019 A | | 12/1985 | Kotliar et al. | |
| 5,385,710 A | * | 1/1995 | Schnittgrund | .......... A62D 3/32 422/240 |

FOREIGN PATENT DOCUMENTS

| | | | | |
|---|---|---|---|---|
| DE | 4418517 C1 | * | 7/1995 | ............ C03B 40/02 |
| GB | 1428888 A | * | 3/1976 | .......... C04B 35/013 |
| JP | H0624873 A | * | 2/1994 | .......... C04B 41/478 |
| WO | WO-2018175233 A1 | * | 9/2018 | ............. B32B 15/00 |

* cited by examiner

*Primary Examiner* — Karl E Group
(74) *Attorney, Agent, or Firm* — Hartman Global IP Law; Gary M. Hartman; Domenica N. S. Hartman

(57) ABSTRACT

Methods, materials systems, and devices for inhibiting the infiltration and penetration of molten salts into solid materials, including porous materials at temperatures above the solidus temperature of the molten salt. The methods, materials systems, and devices utilize a non-wetted solid that is introduced into pores having entrances at an exterior surface of a porous solid material adapted to contact the molten salt.

10 Claims, 4 Drawing Sheets

METHODS, MATERIALS SYSTEMS, AND DEVICES FOR INHIBITING INFILTRATION AND PENETRATION OF MOLTEN SALTS INTO SOLID MATERIALS

CROSS-REFERENCE TO RELATED APPLICATION

This application claims the benefits of U.S. Provisional Application Ser. No. 62/888,097 filed Aug. 16, 2019. The contents of this prior patent document are incorporated herein by reference entirely.

STATEMENT REGARDING GOVERNMENT FUNDING

This invention was made with government support under Contract No. DE-EE0008375 awarded by Department of Energy. The government has certain rights in the invention.

BACKGROUND

This disclosure generally relates to methods, devices, and materials systems for inhibiting the infiltration and penetration of molten salts into porous materials at high temperatures. This disclosure particularly includes methods, devices, and materials systems for inhibiting the infiltration and penetration of molten halide salts, such as molten chloride salts, into porous materials, such as porous ceramic materials, at high temperatures and in non-oxidizing environments. This disclosure also relates to infiltration-resistant and penetration-resistant devices made utilizing the methods and materials systems of this disclosure. Such devices include containment devices, nonlimiting examples of which include pipes, receivers, valves, seals, and thermal energy storage tanks for high-temperature systems, including high-temperature systems for energy (e.g., electrical power) production, energy storage, waste heat recovery, and chemical processing.

This section introduces aspects that may help facilitate a better understanding of the disclosure. Accordingly, these statements are to be read in this light and are not to be understood as admissions about what is or is not prior art.

Molten salts can possess attractive characteristics for use as heat transfer liquids and as thermal energy storage liquids. Such molten salts include, but are not limited to, molten halides, molten nitrates, molten carbonates, molten sulfates, molten hydroxides, and molten oxides. Such molten halides include, but are not limited to, molten chlorides and molten fluorides.

Molten halide salts can possess particularly attractive characteristics for use as high-temperature heat transfer liquids and as high-temperature thermal energy storage liquids. Such attractive characteristics include chemical stability at high temperatures, modest melting points, modest vapor pressures at high temperatures (i.e., high boiling points), modest densities, modest values of viscosity at high temperatures, and high heat capacities per unit volume.

During use as high-temperature heat transfer liquids and high-temperature thermal energy storage liquids, molten salts come into contact with a number of solid materials, such as solid materials used as or as parts of containment devices that contain the molten salt, as nonlimiting examples, pipes and tanks. In order to allow for prolonged, cost-effective use of molten salts as high-temperature heat transfer liquids and high-temperature thermal storage liquids, the solid materials being exposed to such molten salts need to be resistant to infiltration and penetration by such molten salts at high temperatures, generally above the solidus temperature of the molten salt. Infiltration refers herein to the migration of a fluid into a solid via a pathway of pores present in a solid, wherein the fluid is a liquid and/or a gas. Penetration refers herein to the migration of a fluid into the volume occupied by a solid (wherein the fluid is a liquid and/or a gas) other than via a pathway of pores present in the solid, including but not limited to, migration through grain boundaries in the solid, migration through interphase boundaries in the solid, and migration into the volume occupied by the solid through the loss of solid volume due to one or more of a chemical reaction or erosion.

Molten salts tend to wet, infiltrate, and penetrate solid materials, including solid metals, metal alloys, metal-bearing composites, ceramics, and ceramic-bearing composites. Such infiltration and penetration of solid materials by the molten salt can degrade desired properties of the solid materials, with such properties including, but not limited to, mechanical and thermal properties, as a nonlimiting example, thermal conductivity. Such infiltration and penetration of solid materials by a molten salt can also lead to undesired loss of the molten salt during its use as a heat transfer liquid or as a thermal energy storage liquid.

Earth-abundant, low-cost molten chlorides can be particularly attractive as high-temperature heat transfer liquids and high-temperature thermal energy storage liquids. One such group of molten chlorides are $MgCl_2$—$KCl$-bearing salts, including binary $MgCl_2$—$KCl$ compositions and ternary $MgCl_2$—$KCl$—$NaCl$ compositions. Such $MgCl_2$—$KCl$-bearing salts tend to become contaminated with oxygen-bearing species upon exposure to air at high temperatures, and to form $MgO$ or $MgO$-bearing species upon reaction with the oxygen or water vapor in air at high temperatures. In order to minimize contamination and formation of $MgO$ or $MgO$-bearing species, $MgCl_2$—$KCl$-bearing salts may be sealed from the air environment, and/or contained within an inert or reducing atmosphere, and/or exposed to an agent that can act to remove oxygen-bearing species from the molten salt. $MgCl_2$—$KCl$-bearing salts tend to wet, infiltrate, and penetrate solid materials, including solid metals, metal alloys, metal-bearing composites, ceramics, and ceramic-bearing composites in inert atmospheres, including inert argon atmospheres, and in reducing atmospheres, including hydrogen-argon atmospheres.

For example, a molten $MgCl_2$—$KCl$—$NaCl$ salt has been found to infiltrate porous cast $CaO$-rich, $CaO$—$Al_2O_3$-based ceramics in an argon atmosphere at 750° C. Photographs of porous cast $CaO$-rich, $CaO$—$Al_2O_3$-based ceramic crucibles, before and after exposure to a molten $MgCl_2$—$KCl$—$NaCl$ salt, are shown in FIGS. 1A and 1B. The photograph in FIG. 1A shows a crucible comprised of a castable calcium-aluminate-based ceramic composition (ALII-HD, Westmoreland Advanced Materials, Inc., Charleroi, PA). This ceramic material possessed an overall $Al_2O_3$:$CaO$ molar ratio of 4.0:1.0 and contained sintered calcium hexa-aluminate ($CaAl_6O_{19}$) grains bonded with fine cement powder comprising of calcium monoaluminate ($CaAl_2O_4$) and calcium dialuminate ($CaAl_4O_7$), along with some $BaSO_4$. The crucibles shown in FIGS. 1A and 1B were formed by casting a slurry of the ceramic material in water, and then curing the cast crucibles in a humid atmosphere at 35° C. for 24 h and then by heating in ambient air to 110° C. for another 24 hours. The crucibles were then heated at 50° C./h to 750° C. for 5 hours, and then cooled at 180° C./h. A $MgCl_2$—$KCl$—$NaCl$ salt with a composition of 38.8 mol % $MgCl_2$, 41.2 mol % $KCl$, and 20 mol % $NaCl$ was then prepared. The solid salt mixture was heated to 750° C. for 30 min in an industrial-grade argon atmosphere (oxygen partial pressure=$po_2=10^2$ ppm) in a graphite crucible and then cooled at 180° C./h to room temperature. The solidified salt was then added to the cavity in the ceramic crucible (of the type shown in FIG. 1A; cast ALII-HD crucible that had been fired at a peak temperature of 750° C. for 5 hours). To evaluate the infiltration and penetration of the molten $MgCl_2$—KCl—NaCl salt into the porous ceramic crucible, the solid $MgCl_2$—KCl—NaCl salt-bearing crucible was heated in an industrial-grade argon atmosphere ($po_2=10^2$ ppm) to 750° C. (above its solidus temperature) at 100° C./h, held for 2 hours at 750° C., and then cooled at 180° C./h to room temperature. The photograph in FIG. 1B shows the $MgCl_2$—KCl—NaCl salt-bearing ceramic crucible after such exposure. The observed discoloration surrounding the cavity of the crucible indicated that the molten salt had penetrated an appreciable distance (up to roughly 8 mm) within only 2 hours at a peak temperature of 750° C. Such infiltration and penetration are highly undesired for cast porous ceramic coatings that are intended to be used as thermal insulation to contain the molten salt. Such molten salt wetting and infiltration into porous containment materials results in a reduction in the porosity of the containment material, a corresponding reduction in the ability of the containment material to act as a thermal insulator, and an undesired loss of molten salt.

As a second example, a molten $MgCl_2$—KCl—NaCl salt has been found to infiltrate porous cast $Al_2O_3$-rich CaO—$Al_2O_3$-based ceramics in an argon atmosphere at 750° C. Photographs of porous CaO—$Al_2O_3$-based ceramic crucibles, before and after exposure to a molten $MgCl_2$—KCl—NaCl salt, are shown in FIGS. 2A and 2B. The photograph in FIG. 2A shows a crucible comprised of a castable calcium-aluminate-based ceramic composition (BLG, Westmoreland Advanced Materials, Inc., Charleroi, PA). The calcium-aluminate-based material possessed an overall $Al_2O_3$:CaO molar ratio of 5.9:1.0, and was comprised predominantly of calcium hexaluminate ($CaAl_{12}O_{19}$). The crucibles shown in FIGS. 2A and 2B were formed by casting a slurry of the ceramic material in water, and then curing the cast crucibles in a humid atmosphere at 35° C. for 24 hours and then by heating in ambient air to 110° C. for another 24 hours. The crucibles were then heated at 50° C./h to 750° C. for 5 hours, and then cooled at 180° C./h. A $MgCl_2$—KCl—NaCl salt with a composition of 39.6 mol % $MgCl_2$, 42.1 mol % KCl, and 18.3 mol % NaCl was then prepared. The solid salt mixture was heated to 750° C. for 30 minutes in an industrial-grade argon atmosphere (oxygen partial pressure=$po_2=10^2$ ppm) in a graphite crucible and then cooled at 180° C./h to room temperature. The solidified salt was then added to the cavity in the ceramic crucible (of the type shown in FIG. 2A; cast BLG crucible that had been fired at a peak temperature of 750° C. for 5 h). To evaluate the infiltration and penetration of the molten $MgCl_2$—KCl—NaCl salt into the porous ceramic crucible, the solid $MgCl_2$—KCl—NaCl salt-bearing crucible was heated in an industrial-grade argon atmosphere ($po_2=10^2$ ppm) to 750° C. (above its solidus temperature) at 100° C./h, held for 2 hours at 750° C., and then cooled at 180° C./h to room temperature. The crucibles were weighed at the following sequential stages: i) after BLG crucible firing at 750° C. in air, ii) after loading with the solid $MgCl_2$—KCl—NaCl salt at room temperature, and iii) after molten salt exposure for 2 hours at 750° C. (to account for mass loss due to salt evaporation). The photograph in FIG. 2B shows the $MgCl_2$—KCl—NaCl salt-bearing ceramic crucible after such exposure. As seen by the circular discoloration on the top of this specimen in FIG. 2B, appreciable infiltration of the $MgCl_2$—KCl—NaCl salt had occurred within only 2 hours at 750° C. After removing the residual solidified salt from the crucible cavity, and after factoring out the mass loss due to salt evaporation, this carbon-free BLG crucible specimen was found to exhibit a mass gain of 8.87 grams, which corresponded to the penetration of 93.2% of the non-evaporated salt into the specimen. Such infiltration and penetration are highly undesired for cast porous ceramic coatings that are intended to be used as thermal insulation to contain the molten salt. For example, molten salt wetting and infiltration into porous containment materials results in a reduction in the porosity of the containment material, a corresponding reduction in the ability of the containment material to act as a thermal insulator, and an undesired loss of molten salt.

Another group of such molten chlorides are $CaCl_2$)—NaCl-bearing salts, including binary $CaCl_2$)—NaCl compositions, ternary $CaCl_2$)—NaCl—$BaCl_2$, and quaternary $CaCl_2$—NaCl—$BaCl_2$—KCl compositions. Such $CaCl_2$)—KCl-bearing salts tend to wet, infiltrate, and penetrate solid materials, including solid metals, metal alloys, metal-bearing composites, ceramics, and ceramic-bearing composites in air, in inert atmospheres, including inert argon atmospheres, and in reducing atmospheres, including hydrogen-argon atmospheres.

Existing methods to reduce such molten salt infiltration and penetration into containment materials include the use of a completely dense (non-porous) external coating on the containment material that prevents the penetration of the molten salt into the interior of the containment material, and the use of a non-dense external coating that is not wetted by the molten salt, and that thereby inhibits infiltration of the molten salt into the interior of the containment material. However, such coatings, or sections of such coatings, may be removed from the external surface of the containment material during installation of the containment material, for example, by abrasion during installation of the containment material, or during use of the containment material, such as by erosion during use of the containment material (i.e., by erosion from contact with the flowing molten salt) or such as by thermal stresses that may be encountered during heating or cooling of the coated containment material. The loss of continuity of such external coatings would then provide a pathway for the infiltration and penetration of the molten salt into the containment material. Such external coatings would require regular inspections to determine whether the external coating has been retained as a continuous layer within a given time, and whether the coating needs to be repaired if the coating has been partially removed. Such regular inspection and regular repair can result in undesired downtime and additional undesired costs.

Existing methods to reduce molten salt infiltration and penetration into containment materials also include the use of a completely-dense (non-porous) containment material that prevents the penetration of the molten salt into the interior of the containment material. Such completely-dense containment materials include, but are not limited to, completely-dense carbon, completely-dense metal, completely-dense metal alloy, completely-dense ceramic, a completely-dense ceramic alloy, or a completely-dense composite comprised of two or more or carbon, metals, metal alloys, ceramics, and ceramic alloys. However, the costs of completely dense containment materials for large storage tanks and long pipe lengths would be prohibitively expensive.

Existing methods to reduce molten salt infiltration and penetration into containment materials also include the use of a non-dense (porous) containment material that is not wetted by the molten salt and that thereby inhibits infiltration of the molten salt into the interior of the containment material. Examples of porous, non-wetted containment materials include, but are not limited to, porous non-wetted carbon, porous non-wetted hydrocarbon, and a porous non-wetted composite comprised of two or more carbon and hydrocarbon materials. Examples of porous non-wetted carbon materials include, but are not limited to, porous non-wetted graphite, porous non-wetted graphite amorphous carbon, porous non-wetted graphite partially-graphitized carbon, porous non-wetted graphite, partially-amorphous carbon, and mixtures of two or more of porous non-wetted graphite, porous non-wetted graphite amorphous carbon, porous non-wetted graphite partially-graphitized carbon, porous non-wetted graphite, and partially-amorphous carbon. However, porous non-wetted carbon and hydrocarbon containment materials can be removed during use of the containment material, for example by erosion during use of the containment material (i.e., by erosion from contact with the flowing molten salt). Such porous non-wetted containment materials would require regular inspections to determine whether the containment material has been retained as a continuous layer within a given time, and whether the containment material needs to be repaired if the containment material has been partially removed, for example, by partial removal due to erosion from contact with the flowing molten salt. Such regular inspection and regular repair can result in undesired downtime and additional undesired costs.

A nonlimiting example of a system that requires containment materials that are resistant to infiltration and penetration by molten salts at high temperatures is a Concentrated Solar Power plant. Molten chloride salts, such as $MgCl_2$—KCl—NaCl salts, can be attractive for use as low-cost, readily-available (sea-water-derived), high-temperature fluids for heat transfer (e.g., to transfer solar heat from a receiver to a working fluid through a heat exchanger, or to transfer solar heat to a thermal energy storage tank). However, the effective use of molten chloride salts as heat transfer media and as thermal energy storage media requires the use of containment materials (e.g., in pipes, in thermal energy storage tanks) that are not infiltrated and penetrated by such molten salts. Molten salt infiltration and penetration results in an undesired loss of the molten salts and can result in degradation of the thermal and mechanical properties of the containment materials. For example, the thermal insulation capability of a porous containment material in contact with the molten chloride salt in a thermal energy storage tank can be degraded by the infiltration of the molten chloride salt into the pores of the containment material (since air is a much better thermal insulator than the molten chloride).

Thus, there is an unmet need for cost-effective methods and materials that are capable of inhibiting the infiltration and penetration of solid containment materials by molten salts at high temperatures. Such methods and materials preferably provide resistance to infiltration and penetration of solid containment materials by molten salts at high temperatures while also being resistant to abrasion, resistant to erosion, and resistant to heating and cooling of the containment material.

BRIEF DESCRIPTION OF THE INVENTION

The present invention provides methods, devices, and materials systems for inhibiting the infiltration and penetration of molten salts into solid materials, including porous materials at high temperatures.

According to one aspect, a method is provided that enhances the resistance of porous solid materials to the infiltration and penetration of a molten salt. The method includes providing a porous solid material having an exterior surface adapted to contact the molten salt and pores having entrances at the exterior surface, and introducing into the pores of the porous solid material a non-wetted solid that is not infiltrated or penetrated by the molten salt. The porous solid material provides erosion resistance in contact with a flowing molten salt, whereas the non-wetted solid present within the pores of the porous solid material provides resistance to infiltration and penetration of the flowing molten salt.

According to another aspect, a materials system is provided that is resistant to the infiltration and penetration of a molten salt. The materials system includes a porous solid material having an exterior surface adapted to contact the molten salt and pores having entrances at the exterior surface, and a non-wetted solid that is not infiltrated or penetrated by the molten salt and is within the pores of the porous solid material. The porous solid material provides erosion resistance in contact with a flowing molten salt, whereas the non-wetted solid present within the pores of the porous solid material provides resistance to infiltration and penetration of the flowing molten salt.

According to another aspect, a device is provided that is resistant to the infiltration and penetration of a molten salt. The device includes a porous solid material having an exterior surface in contact with the molten salt and pores having entrances at the exterior surface, and a non-wetted solid that is not infiltrated or penetrated by the molten salt and is within the pores of the porous solid material. The porous solid material provides erosion resistance in contact with a flowing molten salt, whereas the non-wetted solid present within the pores of the porous solid material provides resistance to infiltration and penetration of the flowing molten salt.

Technical aspects of methods, devices, and materials systems as described above preferably include the ability to provide resistance to infiltration and penetration of solid containment materials by molten salts at high temperatures. Because the non-wetted solid need only be present within the pores of the porous solid material, the resistance to infiltration and penetration offered by the non-wetted solid is hardly if at all degraded by abrasion, erosion, and thermal cycling of the porous solid material. Unlike containment materials comprised solely of porous, non-wetted solids that are prone to abrasion and erosion, the non-wetted solid is contained within the pores of the porous solid material with the porous solid material providing erosion resistance in contact with a flowing molten salt, and the non-wetted solid present within the pores of the porous solid material provides resistance to infiltration and penetration of the molten salt. Furthermore, because the non-wetted solid need only be introduced into interior surface portions of the pores that are contiguous with or immediately adjacent the exterior surface of the porous solid material, in other words the entrances of the pores, so that the non-wetted solid only penetrates a portion of the thickness of the porous solid material and the bulk of the porous solid material remains porous, the non-wetted solid can result in minimal or negligible degradation of the thermal insulation capabilities of the porous solid material. As such, the methods, devices, and materials systems allow for prolonged, cost-effective use of molten salts as high-temperature heat transfer liquids and high-temperature thermal storage liquids in a variety of high-temperature systems, including high-temperature systems for energy.

Other aspects and advantages of this invention will be appreciated from the following detailed description.

BRIEF DESCRIPTION OF DRAWINGS

Some of the figures shown herein include dimensions. Further, some of the figures shown herein have been created from photographs that are scalable. It is understood that such dimensions or the relative scaling within a figure are by way of example, and not to be construed as limiting. Further, in this disclosure, the figures are shown for illustrative purposes and those skilled in the art can readily recognize the relative dimensions of the different segments of the figures depending on how the principles of the disclosure are used in practical applications.

DETAILED DESCRIPTION OF THE INVENTION

Figure 1B:
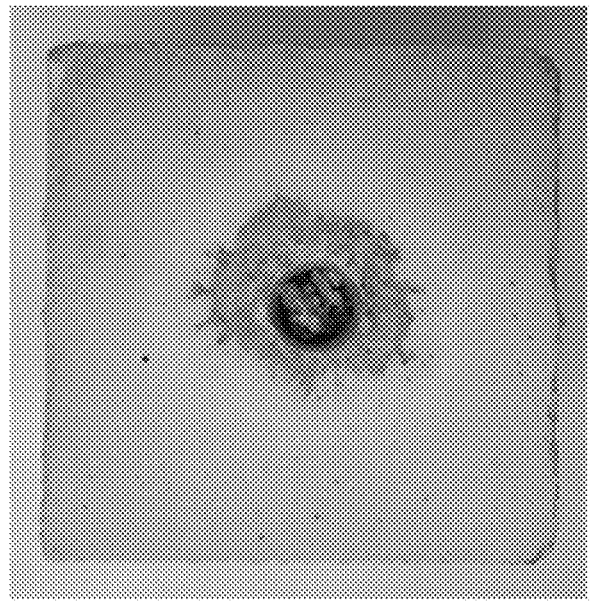
FIG. 1A provides a top-down photograph of a porous, calcia-rich, calcium aluminate-based cast ceramic (AL II-HD, a castable composition obtained from Westmoreland Advanced Materials, Inc., Charleroi, PA) crucible that had been heated at a peak temperature of 750° C. for 5 hours in air, and FIG. 1B provides a top-down photograph of a 750° C.-fired calcium aluminate-based ceramic crucible (AL II-HD) after exposure to a molten $MgCl_2$—KCl—NaCl salt at a peak temperature of 750° C. for 2 hours in industrial-grade argon. The fired, cube-shaped crucibles in FIGS. 1A and 1B possessed edge lengths of 4.6 cm and cavity diameters of 7.6 mm.
Figure 1A:
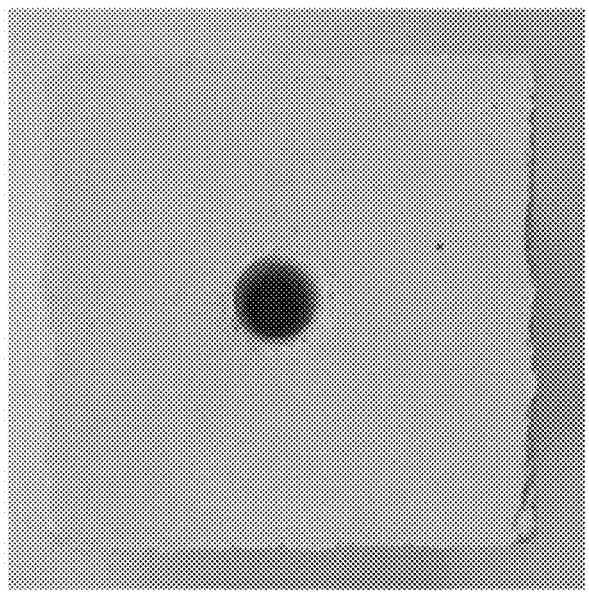
Figure 2B:
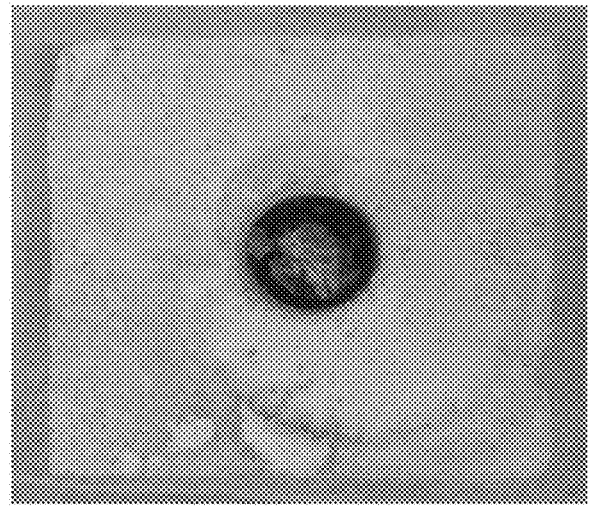
FIG. 2A provides a top-down photograph of a porous, alumina-rich, calcium aluminate-based ceramic (BLG, a castable composition obtained from Westmoreland Advanced Materials, Inc., Charleroi, PA) crucible that had been heated at a peak temperature of 750° C. for 5 hours in air, and FIG. 2B provides a top-down photograph of a 750° C.-fired calcium aluminate-based ceramic crucible (BLG) after exposure to a molten $MgCl_2$—KCl—NaCl salt at a peak temperature of 750° C. for 2 hours in industrial-grade argon. The fired, cube-shaped crucibles in FIGS. 2A and 2B possessed edge lengths of 7.1 cm and cavity diameters of 2.0 mm.
Figure 2A:
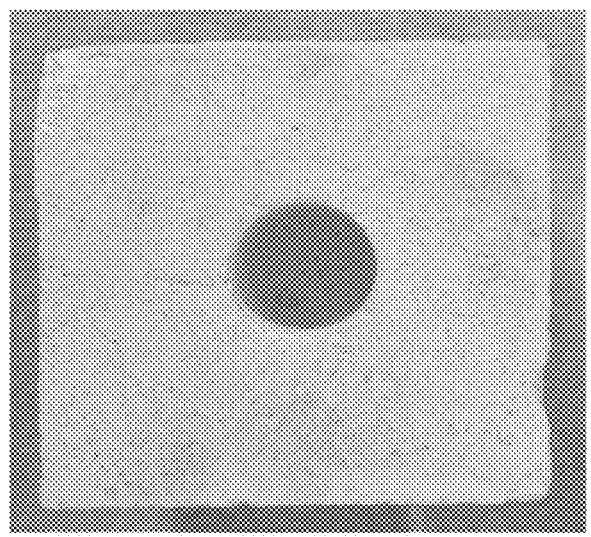

For the purposes of promoting an understanding of the principles of the disclosure, reference will now be made to the embodiments illustrated in the figures and specific language will be used to describe the same. It will nevertheless be understood that no limitation of the scope of the disclosure is thereby intended, such alterations and further modifications in the principles of the disclosure, and such further applications of the principles of the disclosure as illustrated therein being contemplated as would normally occur to one skilled in the art to which the disclosure relates.

The present disclosure relates to methods, materials systems, and devices for inhibiting the infiltration and penetration of molten salts into solid materials, nonlimiting examples of which include containment materials comprised of metals, metallic alloys, metal-bearing composites, ceramics, and ceramic-bearing composites. The present disclosure also relates to methods, materials systems, and devices for inhibiting the infiltration and penetration of molten salts at high temperatures (e.g., above the solidus temperatures of the salts) into containment materials comprised of porous metals, porous metallic alloys, porous metal-bearing composites, porous ceramics, and porous ceramic-bearing composites. The present disclosure also relates to methods, materials systems, and devices for inhibiting the infiltration and penetration of molten salts at high temperatures into containment materials comprised of thermally-insulating materials comprised of porous metals, porous metallic alloys, porous metal-bearing composites, porous ceramics, and porous ceramic-bearing composites. It should be noted that the molten salts of interest to the present invention include, but are not limited to, any one of the following materials or any combinations of the following materials: chloride-bearing liquids, fluoride-bearing liquids, nitrate-bearing liquids, sulfate-bearing liquids, carbonate-bearing liquids, hydroxide-bearing liquids, and oxide-bearing liquids.

The present disclosure also provides methods and materials systems for achieving the infiltration resistance and penetration resistance to molten salts of solid metals, metallic alloys, metal-bearing composites, ceramics, and ceramic-bearing composites used in components in high-temperature systems. Examples of such high-temperature systems include, but are not limited to, systems for energy (e.g., electrical power) production, energy storage, waste heat recovery, and chemical processing. Examples of electrical power production systems in the context of this disclosure include, but are not limited to, systems for fossil fuel-derived power, solar energy-derived power, and nuclear energy-derived power. Solar energy-derived power production systems in the context of this disclosure include but not limited to concentrating solar power production systems. Components in the context of this disclosure suitable for use in such high temperature systems include, but are not limited to, pipes, valves, and thermal energy storage containers that may be required to continuously operate at temperatures above the solidus temperature of the molten salt used by the system.

The following description provides specific examples of the above general concepts of this disclosure with reference to several solid materials, alloys, solid products and liquids. These are merely exemplary embodiments and are not intended to limit the scope of this disclosure.

The infiltration and penetration of a solid material by a molten salt in a given environment can be inhibited by introducing, into such a solid material, a second solid phase that is not wetted or is poorly wetted by the molten salt. As a matter of convenience, such a second non-wetted or poorly-wetted solid phase is referred to herein as a "non-wetted solid," and defined as a solid phase that is not wetted or is poorly wetted by a molten salt, as nonlimiting examples, molten halide salts including molten chloride salts and molten fluoride salts. To inhibit the infiltration and penetration of a molten salt into a porous solid material, the non-wetted solid need only be present within the pores of the porous solid material. Therefore the non-wetted solid is not present solely as a external layer on the exterior surface of the porous solid material that contacts the molten salt, and is not required to be present, and preferably is not present, as a continuous (uninterrupted) external layer on the exterior surface of the porous solid material. Furthermore, the non-wetted solid need only be introduced into interior surface portions of the pores that are contiguous with or immediately adjacent the exterior surface of the porous solid material, in other words the entrances of the pores, so that the non-wetted solid only penetrates a portion of the thickness of the porous solid material and the bulk of the porous solid material remains porous. The non-wetted solid may completely close the entrances of the pores at the exterior surface of the porous solid material, though in many cases the non-wetted solid is not required to completely close the entrances, but instead only partially closes the entrances, for example, by partially or completely coating the interior surface portions of the pores at the entrances of the pores to the extent that the non-wetted solid is present within the pore entrances in an amount sufficient to prevent the molten salt from contacting surfaces of the porous solid material located interiorly of the non-wetted solid.

Non-wetted solids of this invention include, but are not limited to, hydrophobic solids. Non-wetted solids of this invention also include, but are not limited to, carbon-bearing solids, hydrocarbon-bearing solids, mixtures of one or more carbon-bearing solids, mixtures of one or more hydrocarbon-bearing solids, and mixtures of one or more carbon-bearing solids and one or more hydrocarbon-bearing solids. The non-wetted solids may be a carbon-bearing solid produced from pitch, tar, or a mixture of pitch and tar, and/or a hydrocarbon-bearing solid produced from pitch, tar, charcoal, or a mixture of two or more of pitch, tar, and charcoal, and/or a carbon-bearing solid produced from a natural source or a manufactured source, as nonlimiting examples, plants, peat, coal, coal tar, and/or petroleum.

The non-wetted solid may be introduced into the solid containment material by infiltrating a fluid precursor material into the solid containment material, followed by conversion of the fluid precursor material into the non-wetted solid. Such a fluid precursor material may be a liquid precursor material or a vapor precursor material.

The conversion of a liquid precursor material into the non-wetted solid may be accomplished by a thermal treatment. Such a thermal treatment includes, but is not limited to, a thermal treatment to vaporize a volatile constituent of the liquid precursor material, a thermal treatment to crystallize a constituent of the liquid precursor material, and a thermal treatment to allow the liquid precursor material to undergo a chemical reaction.

The method used to convert a vapor precursor material into the non-wetted solid includes, but is not limited to, condensation of the vapor precursor material onto the internal surfaces of the solid containment material and a thermal treatment to allow the vapor precursor material to undergo a chemical reaction.

Figures 3A, 3B, 3C:
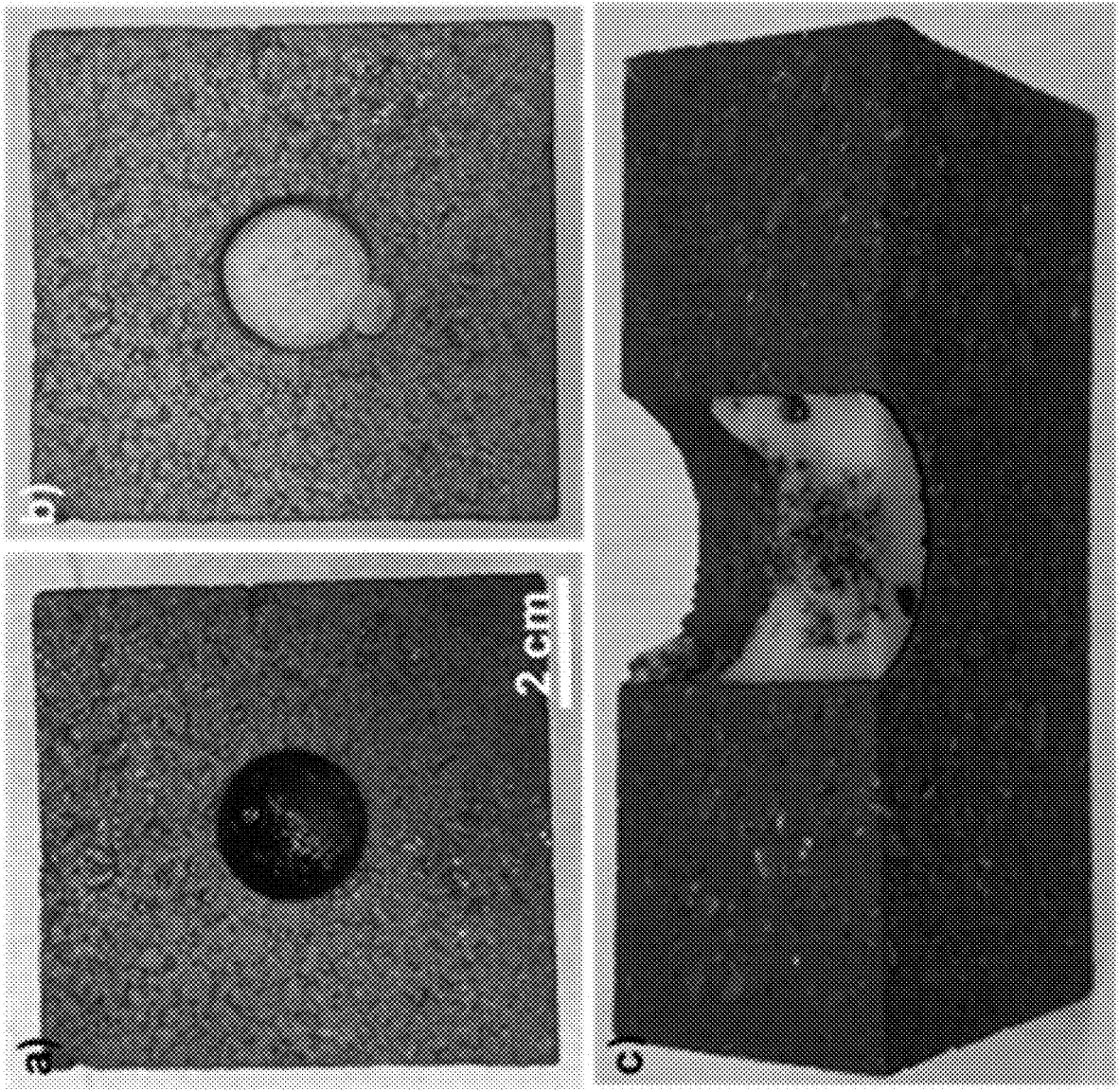
FIG. 3A is a top-down photograph of a porous calcium aluminate-based ceramic (BLG, a castable composition obtained from Westmoreland Advanced Materials, Inc., Charleroi, PA) crucible that has been infiltrated with pitch and then fired at a peak temperature of 750° C. for 5 hours in industrial-grade argon.
FIG. 3B is a photograph showing the same pitch-infiltrated BLG ceramic crucible after exposure to a molten $MgCl_2$—KCl—NaCl salt at a peak temperature of 750° C. for 2 hours in industrial grade argon.
FIG. 3C is a photograph of a cross-section of the sample in FIG. 3B.

FIGS. 3A, 3B, and 3C are photographs associated with a nonlimiting example of the present invention. A porous crucible was prepared from a calcium-aluminate-based ceramic composition (BLG) obtained from Westmoreland Advanced Materials, Inc., Charleroi, PA The calcium-aluminate-based material possessed an overall $Al_2O_3$:CaO molar ratio of 5.9:1.0, and was comprised predominantly of calcium hexaluminate ($CaAl_{12}O_{19}$). The crucible material was formed by pressing and was then heated in air at 25° C./hour to 1500° C. and held at 1500° C. for 5 hours. The resulting porous calcium hexaluminate-based material was then impregnated with LS 250 pitch (Servsteel, Inc., Merrillville, IN) at 360° C. under a partial vacuum for 40 minutes, followed by exposure to an elevated pressure of 60 psi for 45 minutes. The pitch-infiltrated ceramic material was then heated in a nitrogen atmosphere at 750° C. for 2.5 hours, followed by heating in industrial-grade argon to 750° C. for 5 hours. The resulting pitch-infiltrated ceramic crucible is shown in FIG. 3A. The cavity of the pitch-infiltrated ceramic crucible was then filled with a $MgCl_2$—KCl—NaCl salt comprised of 38.8 mol % $MgCl_2$, 41.2 mol % KCl, and 20 mol % NaCl. The salt-filled, pitch-infiltrated ceramic crucible was then heated in an industrial-grade argon atmosphere (oxygen partial pressure of $10^2$ ppm) at 100° C./hour to 750° C. and then held at 750° C. for 2 hours, followed by cooling to room temperature at 180° C./hour. FIG. 3B shows the resulting salt-filled, pitch-infiltrated porous ceramic crucible. A photograph of a cross-section of the crucible in FIG. 3B is shown in FIG. 3C. During handling and preparation of this cross-section, the bulk of the salt was observed to readily separate from the pitch-infiltrated crucible specimen, so that most of the salt was not retained in the cavity after such sectioning. Visual inspection before and after cross-sectioning revealed that the pitch-infiltrated ceramic resisted infiltration and penetration of the molten $MgCl_2$—KCl—NaCl salt at 750° C.

Figure 4B:
FIG. 4B is a photograph showing the same pitch-infiltrated BLG ceramic crucible from FIG. 4A after exposure to a molten $MgCl_2$—KCl—NaCl salt at a peak temperature of 750° C. for 2 hours in industrial-grade argon.
Figure 4A:
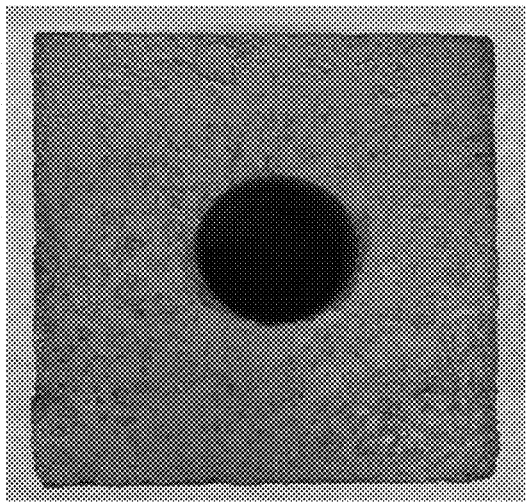
FIG. 4A is a top-down photograph of a porous calcium aluminate-based cast ceramic (BLG, a castable composition obtained from Westmoreland Advanced Materials, Inc., Charleroi, PA) crucible that has been infiltrated with pitch after firing at a peak temperature of 750° C. for 5 hours in industrial-grade argon.
Figure 4C:
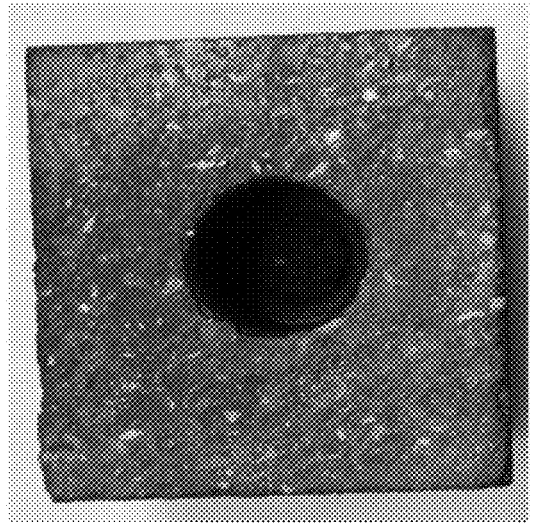
FIG. 4C is a photograph of the pitch-infiltrated BLG ceramic crucible from FIG. 4B after removal of the solidified $MgCl_2$—KCl—NaCl salt from the central cavity of this crucible.

FIGS. 4A, 4B, and 4C are photographs associated with a second nonlimiting example of the present invention. A porous crucible was prepared from a calcium-aluminate-based ceramic composition (BLG) obtained from Westmoreland Advanced Materials, Inc., Charleroi, PA. The calcium-aluminate-based material possessed an overall $Al_2O_3$:CaO molar ratio of 5.9:1.0, and was comprised predominantly of calcium hexaluminate ($CaAl_{12}O_{19}$). The crucible material was formed by pressing and was then heated in air at 25° C./hour to 1500° C. and held at 1500° C. for 5 hours. The resulting porous calcium hexaluminate-based material was then impregnated with LS 250 pitch (Servsteel, Inc., Merrillville, IN) at 360° C. under a partial vacuum for 40 minutes, followed by exposure to an elevated pressure of 60 psi for 45 minutes. The pitch-infiltrated ceramic material was then heated in a nitrogen atmosphere at 750° C. for 2.5 hours, followed by heating in industrial-grade argon to 750° C. for 5 hours. The resulting pitch-infiltrated ceramic crucible is shown in FIG. 4A. The cavity of the pitch-infiltrated ceramic crucible was then filled with a $MgCl_2$—KCl—NaCl salt comprised of 39.6 mol % $MgCl_2$, 42.1 mol % KCl, and 18.3 mol % NaCl. The salt-filled, pitch-infiltrated ceramic crucible was then heated in an industrial-grade argon atmosphere (oxygen partial pressure of $10^2$ ppm) at 100° C./hour to 750° C. and then held at 750° C. for 2 hours, followed by cooling to room temperature at 180° C./hour. FIG. 4B shows the resulting salt-filled, pitch-infiltrated porous ceramic crucible. The crucibles were weighed at the following sequential stages: i) after BLG crucible firing at 750° C. (in air for pitch-free BLG specimens or in industrial-grade Ar for pitch-bearing specimens), ii) after loading with the solid $MgCl_2$—KCl—NaCl salt at room temperature, iii) after molten salt exposure for 2 h at 750° C. (to account for mass loss due to salt evaporation), and then iv) after the non-infiltrated solidified salt was carefully removed from central crucible cavity. To remove the non-infiltrated solidified salt from the central crucible cavity, the bulk of the non-infiltrated salt was first mechanically removed by careful, gentle scraping. The cavity walls of the pitch-infiltrated BLG sample were also then lightly dabbed with a Q-tip soaked with de-ionized water in order to slowly dissolve the remaining adherent salt on the cavity surfaces, immediately followed by dabbing with a dry Q-tip. It should be noted that this process also appeared to have removed a small amount of the surface carbon from the salt exposed/pitch-infiltrated BLG samples (judging from the dark color of the Q-tips after dabbing). However, the weight difference due to such carbon loss was within the range of the noise of the electronic balance (±0.03 grams) use for weight measurements. Such salt exposed/pitch-infiltrated BLG samples were then dried under vacuum for 1 h and the mass of the infiltrated sample was re-measured. After considering the weight loss due to evaporation of the $MgCl_2$—KCl—NaCl salt over 2 hours at 750° C., a slight mass loss (only 0.1 grams) was obtained relative to the starting pitch-infiltrated BLG crucible, which was likely due to the loss of some carbon, along with the adherent salt on the cavity surfaces, from the specimen (i.e., the Q-tips turned slightly dark after this treatment). In any event, the absence of a weight gain after exposure to the $MgCl_2$—KCl—NaCl salt over 2 hours at 750° C. indicated that negligible infiltration of the molten $MgCl_2$—KCl—NaCl salt had occurred within 2 hours at 750° C. in Ar.

While the detailed description above described the resistance of pitch-infiltrated calcium-aluminate ceramic material to infiltration and penetration by a molten $MgCl_2$—KCl—NaCl salt at 750° C. in industrial-grade argon, the general principles of the disclosure are applicable to any molten salt that is likely to wet, infiltrate, and penetrate a solid containment material.

Based on the foregoing description, it is an objective of this disclosure to describe methods for enhancing the resistance of a solid containment material to infiltration and penetration by molten salts. The molten salts include, but are not limited to, molten halides, molten nitrates, molten carbonates, molten sulfates, molten hydroxides, and molten oxides. Molten halides include, but are not limited to, molten chlorides and molten fluorides. The method includes providing a porous solid containment material and introducing a non-wetted solid into pores of the porous solid containment material. The solid containment material in the method can be comprised of a porous metal, porous metal alloy, porous metal-bearing composite, porous ceramic, and porous ceramic-bearing composite. The non-wetted solid is introduced into the solid containment material by the infiltration of a fluid precursor material into the pores in the solid containment material, followed by conversion of the fluid precursor material, present in the pores of the solid containment material, into the non-wetted solid. Such a fluid precursor material may be a liquid precursor material or a vapor precursor material. The conversion of a liquid precursor material into the non-wetted solid may be accomplished by a thermal treatment. Such a thermal treatment includes, but is not limited to, thermal treatment to vaporize a volatile constituent of the liquid precursor material, thermal treatment to crystallize a constituent of the liquid precursor material, and thermal treatment to allow the liquid precursor material to undergo a chemical reaction. Methods capable of converting a vapor precursor material into the non-wetted solid include, but are not limited to, condensation of the vapor precursor material onto the internal pore surfaces of the solid containment material and thermal treatment to allow the vapor precursor material to undergo a chemical reaction.

It is another objective of this disclosure to describe materials systems for enhancing the resistance of a solid containment material to infiltration and penetration by a molten salt. The molten salts include, but are not limited to, molten halides, molten nitrates, molten carbonates, molten sulfates, molten hydroxides, and molten oxides. Molten halides include, but are not limited to, molten chlorides and molten fluorides. The materials system includes a solid containment material possessing pores, and a non-wetted solid that has been introduced into the pores of the solid containment material. Solid containment materials include, but are not limited to, porous metals, porous metal alloys, porous metal-bearing composites, porous ceramics, and porous ceramic-bearing composites. The non-wetted solids include, but are not limited to, hydrophobic solids. Examples of non-wetted solids include, but are not limited to, carbon-bearing solids, hydrocarbon-bearing solids, mixtures of one or more carbon-bearing solids, mixtures of one or more hydrocarbon-bearing solids, and mixtures of one or more carbon-bearing solids and one or more hydrocarbon-bearing solids. The non-wetted solids include, but are not limited to, carbon-bearing solids produced from pitch, tar, charcoal, or a mixture of two or more of pitch, tar, and charcoal. The non-wetted solids further include, but are not limited to, hydrocarbon-bearing solids produced from pitch, tar, charcoal, or mixtures of two or more of pitch, tar, and charcoal. The non-wetted solids also include, but are not limited to, carbon-bearing solids produced from a natural source or a manufactured source. The non-wetted solids also include, but are not limited to, hydrocarbon-bearing solids produced from natural sources or manufactured sources, including, but is not limited to, plants, peat, coal, coal tar, pitch, charcoal, petroleum, and mixtures of two or more of plants, peat, coal, coal tar, pitch, charcoal, petroleum.

It is another objective of this disclosure to describe materials systems for enhancing the resistance of a solid containment material to infiltration and penetration by a molten salt, while also being resistant to abrasion and erosion. The molten salts include, but are not limited to, molten halides, molten nitrates, molten carbonates, molten sulfates, molten hydroxides, and molten oxides. Molten halides include, but are not limited to, molten chlorides and molten fluorides. The materials system includes a solid containment material possessing pores, and a non-wetted solid that has been introduced into the pores of the solid containment material. Solid containment materials include, but are not limited to, porous metals, porous metal alloys, porous metal-bearing composites, porous ceramics, and porous ceramic-bearing composites. The non-wetted solids include, but are not limited to, hydrophobic solids. Examples of non-wetted solids include, but are not limited to, carbon-bearing solids, hydrocarbon-bearing solids, mixtures of one or more carbon-bearing solids, mixtures of one or more hydrocarbon-bearing solids, and mixtures of one or more carbon-bearing solids and one or more hydrocarbon-bearing solids. The non-wetted solids include, but are not limited to, carbon-bearing solids produced from pitch, tar, charcoal, or a mixture of two or more of pitch, tar, and charcoal. The non-wetted solids further include, but are not limited to, hydrocarbon-bearing solids produced from pitch, tar, charcoal, or mixtures of two or more of pitch, tar, and charcoal. The non-wetted solids also include, but are not limited to, carbon-bearing solids produced from a natural source or a manufactured source. The non-wetted solids also include, but are not limited to, hydrocarbon-bearing solids produced from natural sources or manufactured sources, including, but is not limited to, plants, peat, coal, coal tar, pitch, charcoal, petroleum, and mixtures of two or more of plants, peat, coal, coal tar, pitch, charcoal, petroleum. The porous solid material provides erosion resistance in contact with a flowing molten salt, whereas the non-wetted solid present within the pores of the porous solid material provides resistance to infiltration and penetration of the flowing molten salt.

It is yet another objective of this disclosure to describe devices in high-temperature systems that are resistant to the infiltration and penetration of a molten salt. Examples of such high-temperature systems include, but are not limited to, systems for energy (e.g., electrical power) production, energy storage, waste heat recovery, and chemical processing. Examples of electrical power production systems in the context of this disclosure include, but are not limited to, systems for fossil fuel-derived power, solar energy-derived power, and nuclear energy-derived power. Solar energy-derived power production systems in the context of this disclosure include but are not limited to concentrating solar power production systems. Devices in the context of this disclosure suitable for use in such high temperature systems include, but are not limited to, containment devices, non-limiting examples of which include pipes, receivers, valves, seals, and thermal energy storage tanks, particularly those for use in high-temperature systems, including high-temperature systems for energy (e.g., electrical power) production, energy storage, waste heat recovery, and chemical processing.

It should be recognized that, in the methods, materials systems, and devices of this disclosure, the materials whose resistance to infiltration and penetration by molten salts is desired to be enhanced can be a thermally-insulating material.

While the present disclosure has been described with reference to certain embodiments, it will be apparent to those of ordinary skill in the art that other embodiments and implementations are possible that are within the scope of the present disclosure without departing from the spirit and scope of the present disclosure. For example, the solid containment materials could be formed of materials other than those noted, and could be used in high-temperature applications other than those described. The molten salts could be comprised of materials other than those noted. The non-wetted solid could be comprised of materials other than those noted. Accordingly, it should be understood that the disclosure is not limited to any embodiment described herein. It should also be understood that the phraseology and terminology employed above are for the purpose of describing the disclosed embodiments, and do not necessarily serve as limitations to the scope of the disclosure. Therefore, the scope of the invention is to be limited only by the following claims.

The invention claimed is:

1. A method for enhancing the resistance of a porous solid material to the infiltration and penetration of a molten salt, the method comprising:

providing a porous solid material having an exterior surface adapted to contact the molten salt and pores having entrances at the exterior surface; and introducing into the pores of the porous solid material a non-wetted solid that is not infiltrated or penetrated by the molten salt;

wherein the non-wetted solid is introduced into the pores of the porous solid material by the infiltration of a fluid precursor material to the non-wetted solid into the pores of the porous solid material, followed by conversion of the fluid precursor material into the non-wetted solid within the pores of the porous solid material; and wherein the fluid precursor material to the non-wetted solid comprises a vapor precursor material and the conversion of the vapor precursor material to the non-wetted solid is conducted by one or more of condensation of the vapor precursor material onto the internal surfaces of the porous solid material and a thermal treatment to allow the vapor precursor material to undergo a chemical reaction.

2. The method of claim 1, wherein the non-wetted solid is a hydrophobic solid.

3. The method of claim 1, wherein the non-wetted solid is a carbon-bearing solid, or a hydrocarbon-bearing solid, or a mixture thereof.

4. The method of claim 1, wherein the fluid precursor material to the non-wetted solid further comprises a liquid precursor material to the non-wetted solid, or a mixture of liquid and solid precursor materials to the non-wetted solid.

5. The method of claim 1, wherein the fluid precursor material comprises pitch, tar, or a mixture thereof.

6. The method of claim 1, wherein the fluid precursor material is produced from a natural source or from a manufactured source, wherein the natural source or manufactured source is one of a plant, peat, coal, coal tar, pitch, charcoal, petroleum, or any combination of two or more thereof.

7. The method of claim 4, wherein the conversion of the liquid precursor material to the non-wetted solid, or the conversion of the mixture of liquid and solid precursor materials to the non-wetted solid, is conducted by a thermal treatment.

8. The method of claim 1, wherein the non-wetted solid is present within the pores of the porous solid material and is not present solely as a continuous uninterrupted external layer on the exterior surface of the porous solid material.

9. The method of claim 8, wherein the non-wetted solid only penetrates a portion of a thickness of the porous solid material to completely close, or to partially close, the entrances of the pores at the exterior surface of the porous solid material, and a bulk of the porous solid material remains porous.

10. The method of claim 1, wherein the porous solid material comprises a porous metal, a porous metal alloy, a porous ceramic, a porous ceramic alloy, or a porous mixture of two or more of a porous metal alloy, a porous ceramic, or a porous ceramic alloy.

* * * * *